(12) United States Patent
Cuff et al.

(10) Patent No.: US 7,187,076 B2
(45) Date of Patent: Mar. 6, 2007

(54) INTERPOSER WITH INTEGRAL HEAT SINK

(75) Inventors: Michael P. Cuff, Georgetown, TX (US); John L. Grant, Sherborn, MA (US)

(73) Assignee: AirBorn, Inc., Addison, TX (US)

( * ) Notice: Subject to any disclaimer, the term of this patent is extended or adjusted under 35 U.S.C. 154(b) by 138 days.

(21) Appl. No.: 10/913,743

(22) Filed: Aug. 6, 2004

(65) Prior Publication Data

US 2005/0029652 A1    Feb. 10, 2005

Related U.S. Application Data

(60) Provisional application No. 60/494,013, filed on Aug. 7, 2003.

(51) Int. Cl.
*H01L 23/34* (2006.01)

(52) U.S. Cl. ..................................... 257/713
(58) Field of Classification Search ................ 257/713
See application file for complete search history.

(56) References Cited

U.S. PATENT DOCUMENTS

| | | |
|---|---|---|
| 3,671,917 A | 6/1972 | Ammon et al. |
| 5,158,912 A | 10/1992 | Kellerman et al. |
| 5,367,794 A | 11/1994 | Adelstein et al. |
| 5,570,504 A | 11/1996 | DiStefano et al. |
| 6,220,869 B1 | 4/2001 | Grant et al. |
| 6,301,114 B1 * | 10/2001 | Ootani ........................ 361/704 |
| 6,449,155 B1 | 9/2002 | Colbert et al. |
| 6,459,582 B1 | 10/2002 | Ali et al. |
| 6,483,708 B2 | 11/2002 | Ali et al. |

OTHER PUBLICATIONS

U.S. Appl. No. 10/285,777, filed Nov. 1, 2002, Grant et al.
Polyplastics, "Molding Technology for Fortron", Copyright 2001-2002, Polyplastics Co., Ltd., http://www.polyplastics.com/en/support/tech/pps_mold/index.html, (1 page).

* cited by examiner

*Primary Examiner*—Lex H. Malsawma
(74) *Attorney, Agent, or Firm*—Jenkens & Gilchrist, P.C.

(57) ABSTRACT

An area array connector for providing a thermal and an electrical interconnection between a first circuit element and a second circuit element is described. The area array connector includes at least one electrically conductive interconnector adapted to provide an electrical interconnection between the first circuit element and the second circuit element. The area array connector also includes at least one thermally conductive member adapted to provide thermal interconnection between the first circuit element and the second circuit element.

22 Claims, 11 Drawing Sheets

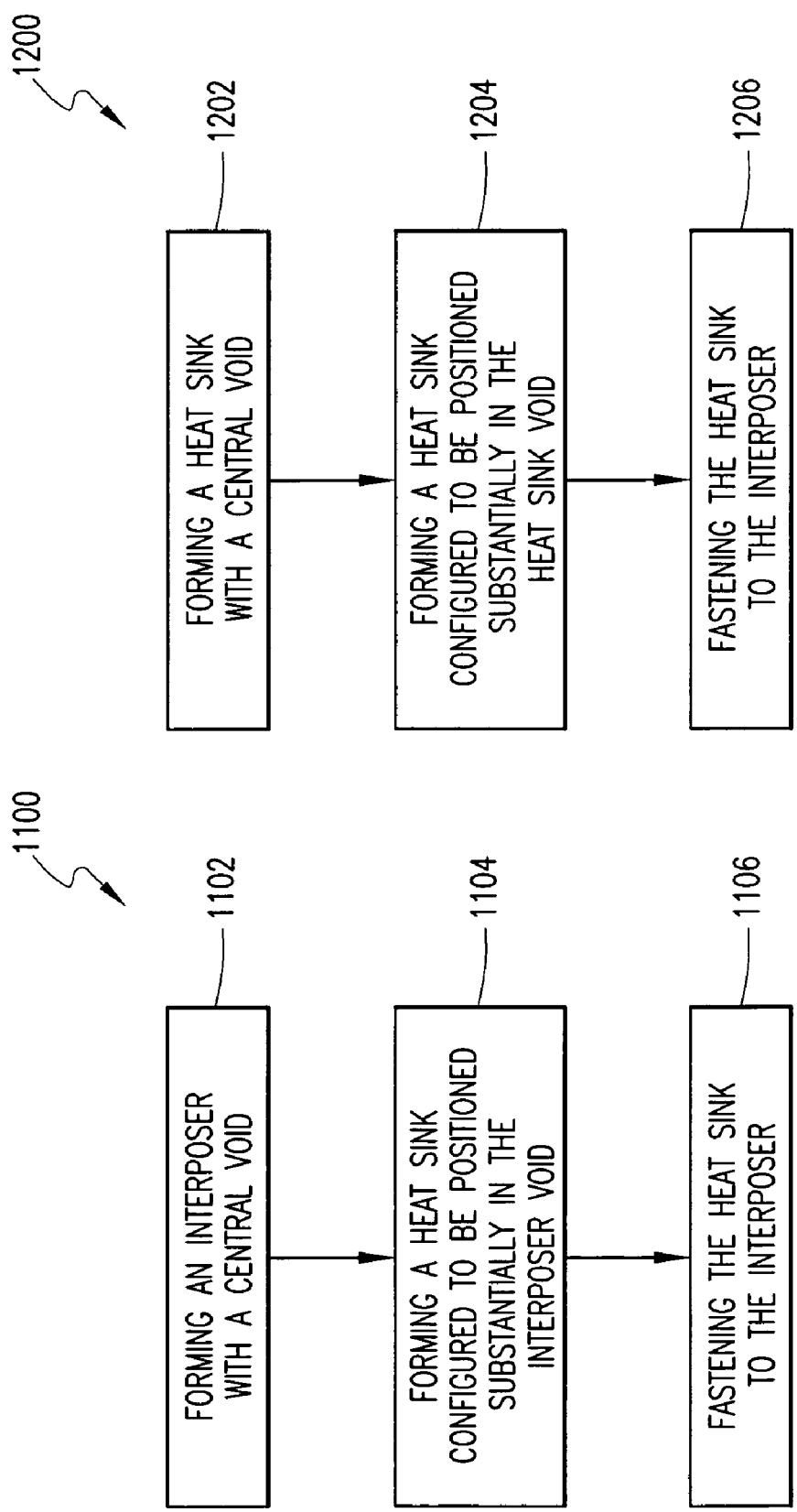

INTERPOSER WITH INTEGRAL HEAT SINK

CROSS-REFERENCE TO RELATED APPLICATIONS

This Application claims the benefit under 35 USC 119(e) of U.S. Provisional Application No. 60/494,013, filed on Aug. 7, 2003.

BACKGROUND OF THE INVENTION

The present invention relates to interposers, such as area array connectors adapted for connecting the contact pads of one generally planar circuit element, such as a printed circuit board, to corresponding contact pads on another generally planar circuit element, such as an integrated circuit or multichip module, and more particularly, but not by way of limitation, to an interposer adapted for both electrical and thermal energy transfer therethrough.

DESCRIPTION OF RELATED ART

The manufacture of printed circuit boards, and more particularly, circuit board connectors, has expanded greatly over the past several decades. Both designs and fabrication techniques have improved to the point that ease in assembly and reliability of connection can almost be guaranteed. Not the least of these developments is the advent of the printed circuit board connector and its assembly to the printed circuit board itself. For example, U.S. Pat. No. 3,671,917 teaches a printed circuit board connector of the "edge connector" variety wherein the contact terminals are first inserted into a substrate and an insulative housing snapped thereover. This particular technology addresses the basic underlying structure of a printed circuit board which includes a mounting board having a plurality of contact terminals mounted therein and insulative housing covering the terminals. In this particular embodiment, the housing comprises an outer shell open at the bottom to permit it to fit down over and enclose the contact terminals and has U-shaped edges at the top to define a printed circuit board receiving opening. The advantages of such assemblies were well known in the '70s when edge connectors were in widespread use. As space became a design criteria, however, the type of connectors and the spacing of such connectors received intense focus.

As referenced above, in many electronic applications, compactness of the electronic assembly is one of the more critical goals. Several approaches have been used for increasing compactness, particularly within the utilization of semiconductor chip assemblies. For example, U.S. Pat. No. 5,367,764 teaches a method of making a multi-layer circuit assembly formed by laminating circuit panels with interposers incorporating flowable conductive material at interconnect locations and a flowable dielectric material at locations other than the interconnect locations. In this way, the flowable materials of the interposers, together with a reservoir, allow the interposers to compress and take up tolerances in the components. The flowable dielectric material encapsulates conductors on the surface of the circuit panels. Similarly, U.S. Pat. No. 5,570,504 teaches a multilayer circuit construction, method and structure made by stacking circuit panels having contacts on their top surface through conductors extending between top and bottom surfaces and terminals connected to the bottom end of each through conductor. These and other interconnecting systems and devices facilitate the aforesaid compactness in the electronic assembly.

Another approach to achieving compactness is to stack circuit cards, such as printed circuit boards, one upon another as referenced above for electrically connecting the circuit cards together. There are many advantages in this approach. In order to make use of such a compact arrangement, it is, however, necessary that the face-to-face connection of circuit cards be made assuredly both electrically and mechanically. Interposers, such as area array connectors, are often used to connect corresponding contact pads on adjacent circuit cards for this purpose.

One interposer design addressing many of these issues is set forth and shown in U.S. Pat. No. 6,220,869, (the '869 patent) assigned the assignee of the present invention and incorporated herein by reference. As shown in the '869 patent, an array connector is adapted to connect contact pads on one generally planar circuit element to corresponding contact pads on another generally planar circuit element. The connector has an insulated contact mounting sheet having a plurality of contact mounting apertures therein. A plurality of electrically conducting contacts are mounted in the contact mounting apertures, each contact having contact pad engaging legs resiliently projecting away from opposite faces of the contact mounting sheet.

Another interposer design address additional design issues is set forth and shown in U.S. patent application Ser. No. 10/285,777 (hereinafter the '777 application) filed Nov. 1, 2002 and assigned to the assignee of the present invention and incorporated herein by reference. As shown in the '777 application, an array connector is shown to be adapted to connect contact pads on a first generally planar circuit element to corresponding contact pads on a second generally planar circuit element by the use of an interposer housing. The interposer housing includes a plurality of electrical contacts strapped in a substantially parallel relationship to one another and wherein in one embodiment, the at least one electrical interconnector is a power interconnector.

It may thus be seen that various enhancements to and advantages for array connectors can be provided by innovations in the design of interposers and the use of such interposers relative to printed circuit boards.

Another design criteria that is often a major consideration in printed circuit board designs is that of heat transfer and/or heat dissipation, relative to various printed circuit board components mounted thereon. The necessity to remove heat from heat generating components has found wide spread focus and innovation. For example, U.S. Pat. No. 6,452,804 describes an assembly for supplying power and removing heat from a microprocessor while controlling electro magnetic emissions. U.S. Pat. No. 6,459,582 and U.S. Pat. No. 6,483,708 teach the use of a heat sink clamping assembly including an electrical circuit assembly, printed circuit board, a backing plate, a clamp plate, a thermal interposer and a heat sink. This assembly is set forth to provide a thermal conducting connection for removing heat from the electrical circuit. Likewise, U.S. Pat. No. 5,158,912 teaches the use of a semiconductor package having an integral heat sink. U.S. Pat. No. 6,449,155 teaches a land grid array subassembly including a stacked assembly of a heat sink, a thermal interface, a multi-chip module, a land grid array interposer, and a protective cover.

An important component of many interposer designs for electrically connecting circuit cards is that of providing power interconnection. In some conventional interposer designs power interconnection is provided through separate, large, discrete power contacts that have to be physically separated from the interposer. In other conventional interposer designs, a number of single electrical contacts are scattered around the interposer and connected electrically in parallel via the power and ground plane circuitry on the circuit card. This interposer design wastes a large amount of valuable circuit card area and creates a problem with what is commonly called "current sharing", i.e., the need to split the current nearly equally between all of the parallel electrical contacts.

These and other designs have been suggested for use in heat dissipation and power interconnection between and/or among the multiple components and assembly members. It would be a distinct advantage therefore to incorporate an improved thermal conductive member in direct association with an interposer permitting the advantage of the interposer as described above in the '777 application and the '869 patent while affording enhanced thermal conductivity in a manner improving the operational efficiency in the structure. The present invention provides such an assembly by the use of an interposer in direct association with the a heat sink assembled therewith.

BRIEF SUMMARY OF THE INVENTION

The present invention relates to interposers adapted to allow both electrical and thermal energy transfer therethrough. More particularly, one aspect of the invention is directed to a connector assembly for providing an electrical interconnection between a first circuit element and a second circuit element. The connector assembly may include an interposer and at least one electrically conductive interconnector disposed within the interposer. The at least one electrically conductive interconnector is adapted to provide an electrical interconnection between the first circuit element and the second circuit element. The assembly may also include at least one thermally conductive member in association with the interposer. The at least one thermally conductive member is adapted to provide thermal interconnection between the first circuit element and the second circuit element.

BRIEF DESCRIPTION OF THE DRAWINGS

For a more complete understanding of the present invention, reference is made to the following detailed description taken in conjunction with the accompanying drawings wherein:

FIG. 11 is a flow diagram of a method of manufacturing the integral heat sink and interposer of FIG. 1; and FIG. 12 is a flow diagram of a method of manufacturing the integral heat sink and interposer of FIG. 6.

DETAILED DESCRIPTION OF THE INVENTION

Figure 1:
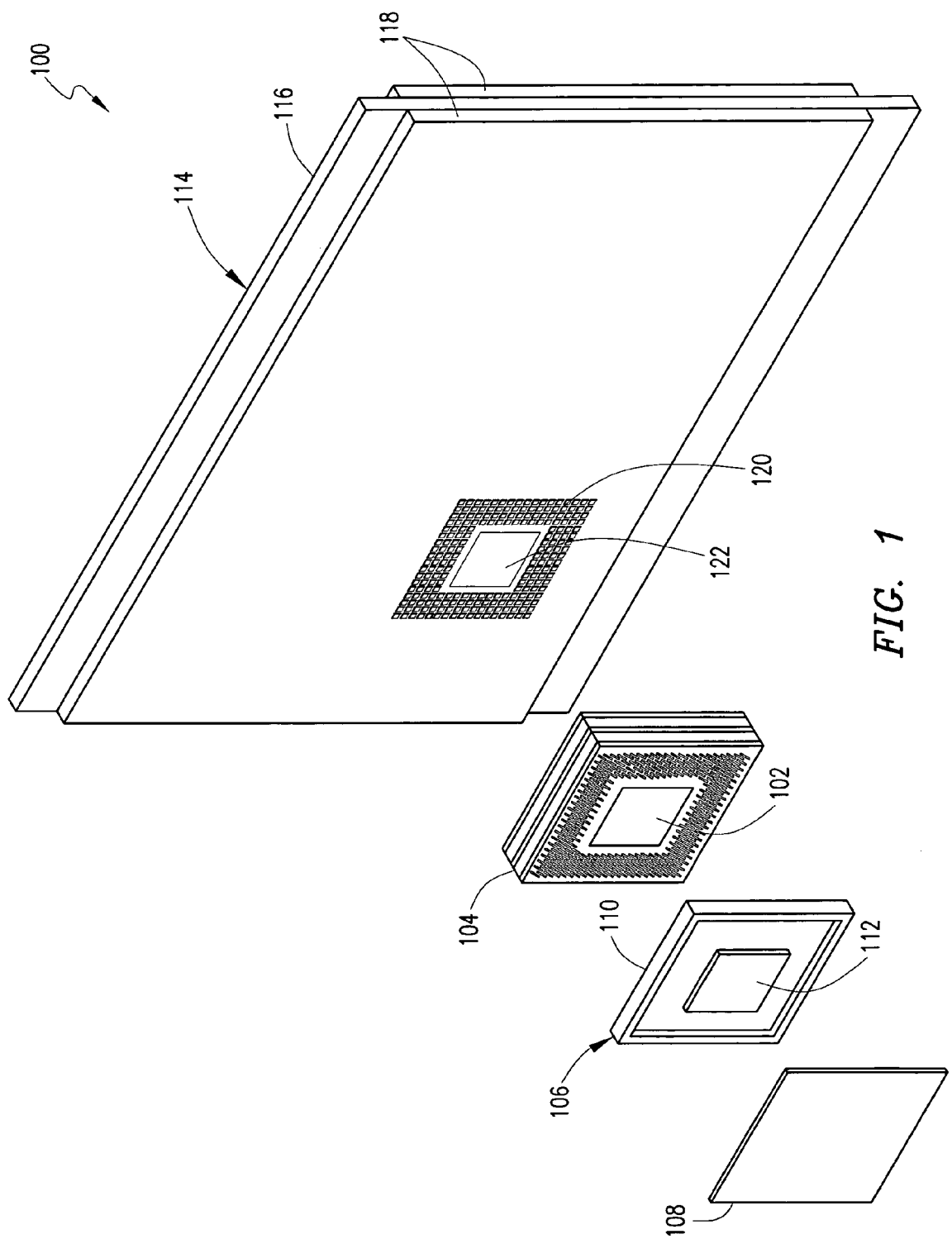
FIG. 1 is an exploded view of a system in accordance with aspects of the present invention.

To improve the heat transfer from heat emitting elements, such as integrated circuits (ICs), a variety of heat dissipation techniques may be applied. In accordance with one embodiment of the present invention, as shown in FIG. 1, a system 100 may implement an integrated heat sink 102 and interposer 104. By including the heat sink 102 at a central portion of the interposer 104, the heat sink 102 improves the heat conduction from an IC package 106 through the system 100. The path of the heat flow from the heat emitting element (IC package 106) maximizes the conductivity of the conduction path and improves heat transfer.

The IC package 106 typically includes an outer ceramic shell 110 and an IC chip 112. The IC package 106 may be protected by a cover 108. The IC package 106 is connected electrically and thermally through the interposer 104 and the heat sink 102 to a printed wiring board (PWB) 114 which may then be integrated within an electronic device such as a flight control computer in a jet fighter or missile. The PWB 114 may include one or more circuitry layers 118 and at least one thermal plane 116. The thermal plane 116 may extend beyond the outside edges of the circuitry layers 118 to contact another system component or a chassis (not shown) of the electronic device. The thermal plane 116 is typically formed of a thermally conductive material and fastened to the chassis by a metal fastener in order to provide a heat conduction path from the thermal plane 116 to the chassis. Also shown on the surface of the PWB 114 near the interposer 104 is a pattern of electrical contact pads 120. The electrical contact pads 120 are typically gold plated and correspond to the signal contact location in the interposer 104, however other materials and orientations are possible. In a central portion of the pattern of electrical contact pads 120 is a large pad 122 which, in this embodiment, is fashioned as a solid metal plug directly connected to the thermal plane 116.

When active, the IC chip 112 emits heat that is transferred to surrounding components. To prevent the heat from destroying the IC chip 112, the heat is transferred from the IC chip 112, through the thermally conductive ceramic IC package, to the large pad 122 via the heat sink 102. The large pad 122 dissipates the heat through the thermal plane 116 to another system component or the chassis (not shown).

Figure 2:
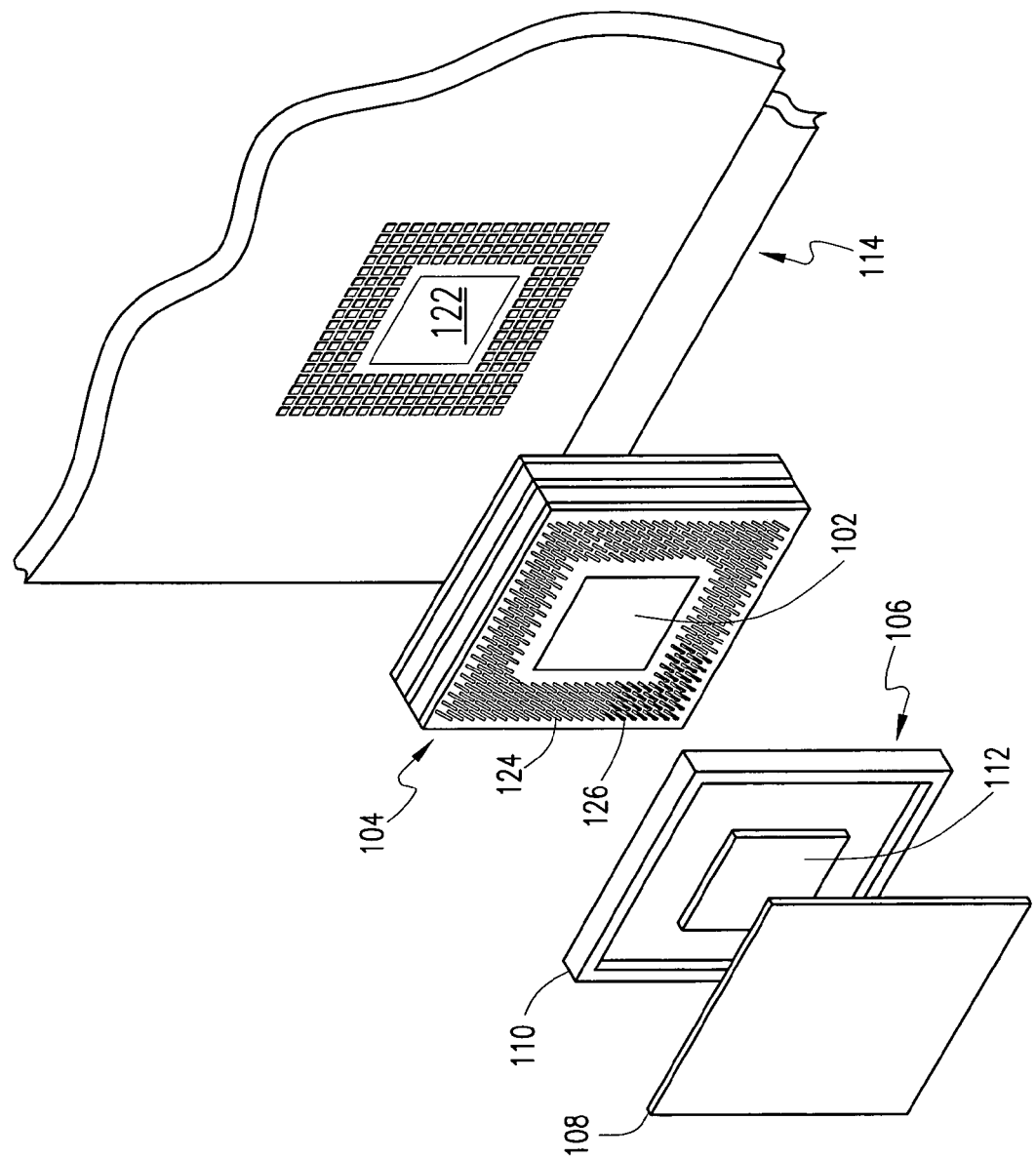
FIG. 2 is an enlarged view of the system of FIG. 1.

Referring now to FIG. 2, an enlarged view of the system 100 of FIG. 1 is illustrated. As shown more clearly in FIG. 2, the interposer 104 includes five layers, although other configurations are possible. The heat sink 102 is located under the IC chip 112 and above the large pad 122 to allow a direct conduction path for the heat to flow from the IC chip 112 to the thermal plane 116. A contact pattern 124 is located on an upper surface of the interposer 104. In one embodiment, the contact pattern 124 may include a 20×20 array of contacts 126, however, the contact pattern 124 may include a variety of shapes and sizes depending on the IC package 106 to be connected to the PWB 114.

Figure 3:
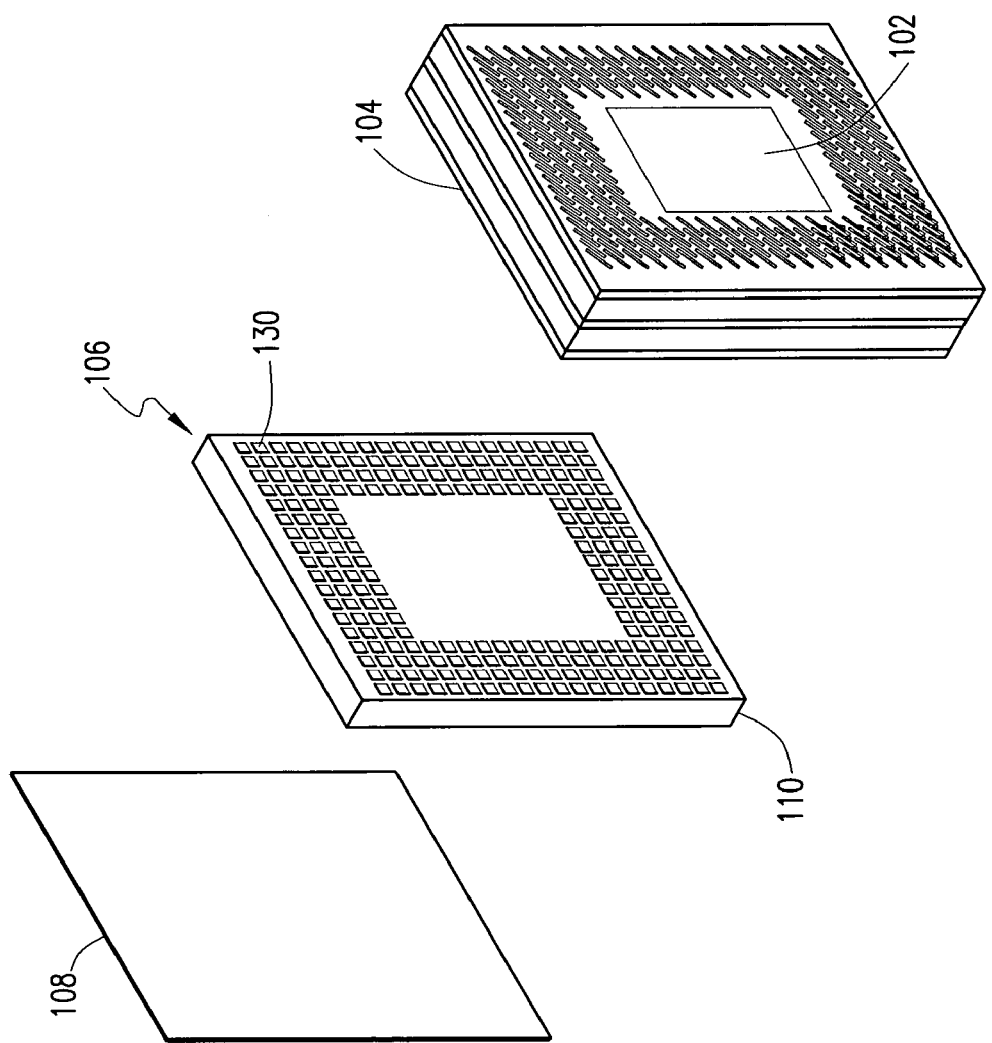
FIG. 3 is an exploded view of a bottom surface of the interposer, IC package, and cover of FIG. 1.

Referring now to FIG. 3, an exploded view of a bottom surface of the interposer 104, IC package 106, and cover 108 of an embodiment of the present invention is illustrated. The bottom surface of the IC package 106 includes pads 130 which are typically gold plated. The locations of the pads 130 correspond to the locations of the contacts 126 on the upper surface of the interposer 104. The IC chip 112 (not shown) is situated on the upper surface of the ceramic shell 110 and a layer of heat conductive ceramic separates the IC chip 112 from the interposer 104. The heat of the IC chip 112 is conducted through the conductive ceramic to the heat sink 102 of the interposer 104.

Figure 4:
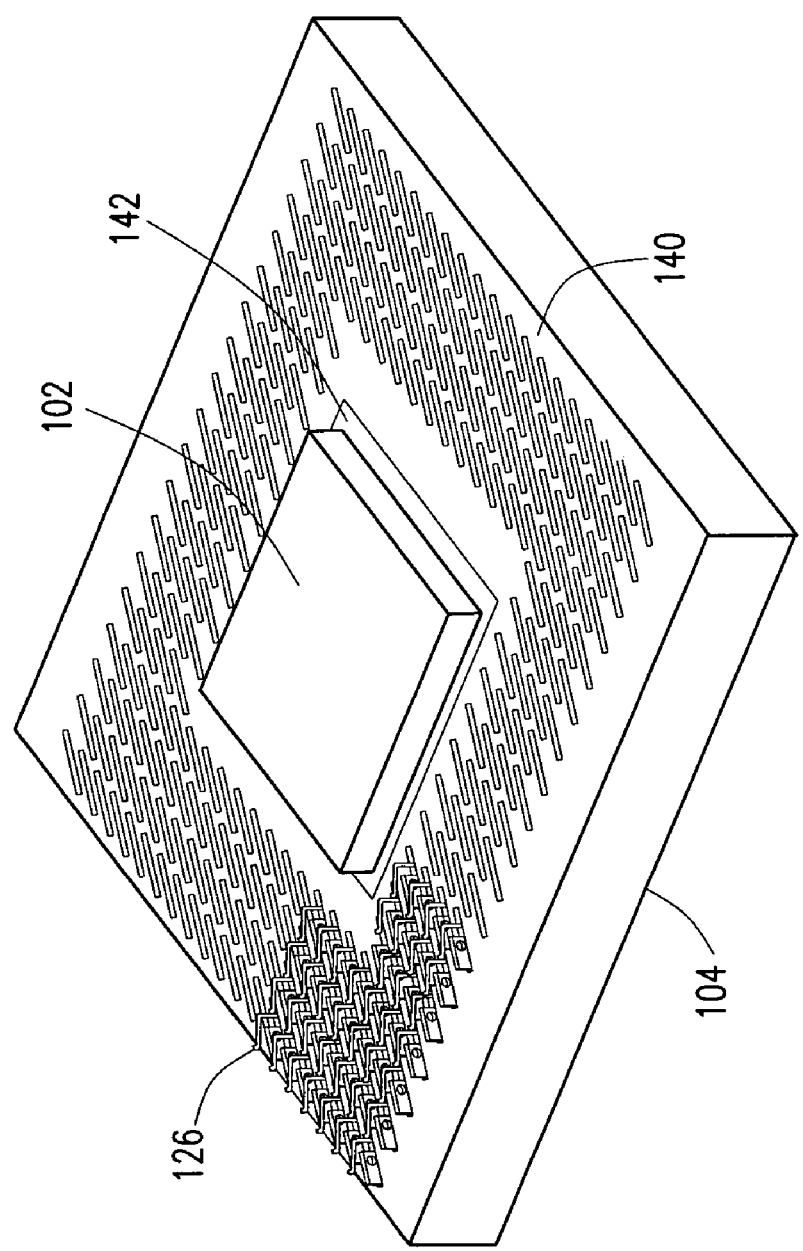
FIG. 4 is a top view of the interposer of FIG. 1 with several layers of the laminated housing and a large fraction of the individual contacts hidden from view in order to make the internal structure of the interposer more readily visible.

Referring now to FIG. 4, a top view of the interposer 104 of an embodiment of the present invention is illustrated. At least one upper layer of the interposer 104 is hidden from view to show an intermediate layer 140 of the interposer 104. The heat sink 102 may include a lip 142 for retaining the heat sink 102 within the interposer 104. In this embodiment, the lip 142 extends slightly beyond the inner perimeter of the central cut-outs in the layers immediately above and below the intermediate layer 140 so that when the at least one upper layer is placed on the upper surface of the intermediate layer 140, the upper and lower layers overlap the extensions on the perimeter of the heat sink thus holding the heat sink 102 in place. Although the present embodiment illustrates the heat sink 102 as including a lip 142 for placement between layers of the interposer 104, the heat sink 102 may be formed so that the lip 142 extends along an upper surface or lower surface of any of the layers of the interposer 104, including the uppermost and lowermost layers. In addition, the heat sink 102 may be held in place by means other than a lip 142. For example, the heat sink 102 may be bonded to the interposer 104. The heat sink 102 shown is a substantially square shape, however other configurations are possible such as a rectangular, pentagonal, or circular shape.

Figure 5:
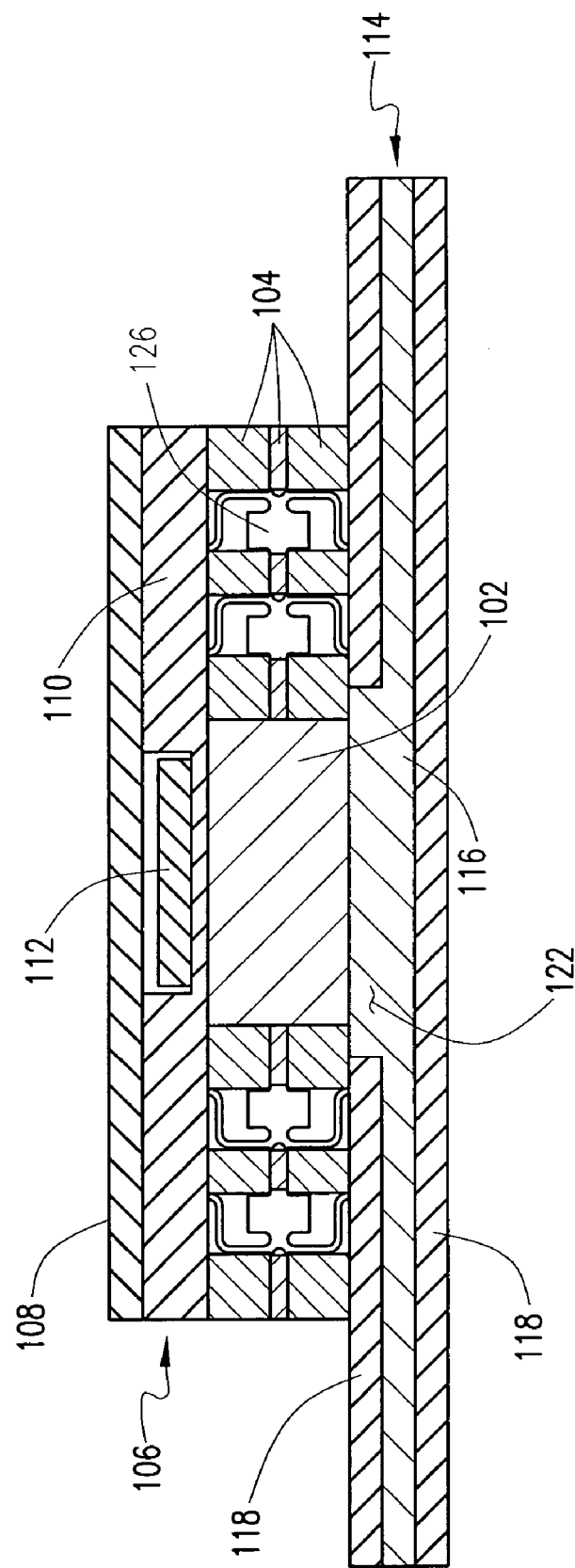
FIG. 5 is an unexploded cross-sectional view of the system of FIG. 1.

Referring now to FIG. 5, a cross-sectional view of the system of FIG. 1 is illustrated. The cover 108 is placed on an upper surface of the IC package 106. The IC package includes the IC chip 112 that is set in the ceramic shell 110. The bottom surface of the IC package 106 rests on a top surface of the interposer 104. The contacts 126 meet the pads 130 of the IC package 106. The heat sink 102 is oriented within the interposer 104 and in a region near the IC chip 112. The interposer 104 and heat sink 102 are oriented above the PWB 114 which includes the thermal plane 116. The thermal plane 116 extends to form the large pad 122 in direct contact with the heat sink 102.

The heat flow begins at the IC chip 112 and is conducted directly through the ceramic shell 110 of the IC package 106 to the heat sink 102. The heat sink 102 allows conduction of the heat to the thermal plane 116 via the large pad 122 (if present). The thermal plane 116 disperses the heat to another system component or the chassis.

Figure 6:
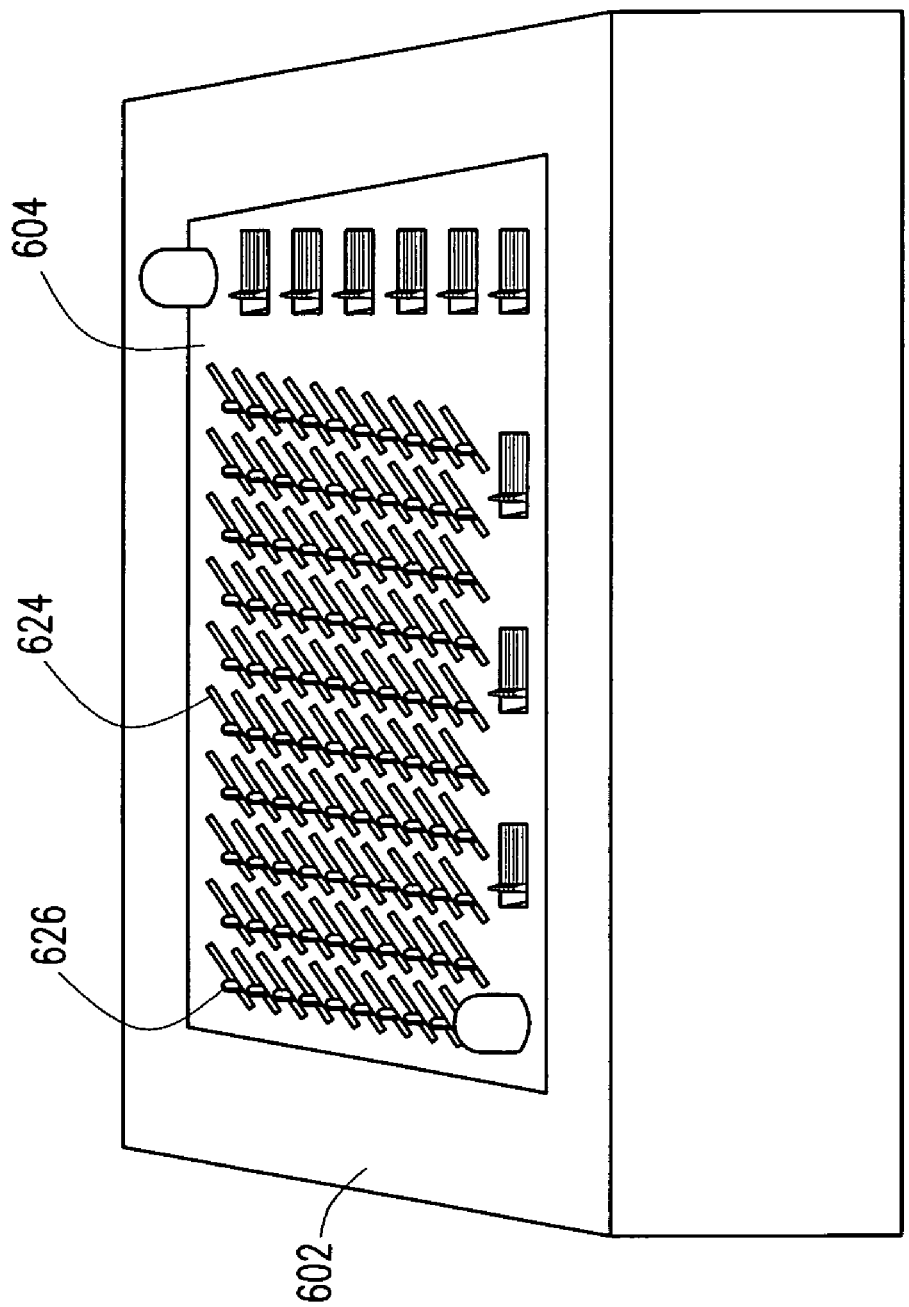
FIG. 6 is a perspective view of an integrated heat sink and interposer according to an aspect of the present invention.

Now referring to FIG. 6, an alternate embodiment of the integrated heat sink 602 and interposer 604 in accordance with an aspect of the present invention is illustrated. In this embodiment, the heat sink 602 is oriented in a ring-type fashion to form an outer border around the interposer 604. The contact pattern 624 is arranged in a central portion of the integrated heat sink 602 and interposer 604. An IC chip (not shown) emits heat that is transferred to the ceramic shell (not shown) and is absorbed by the heat sink 602 at an outer portion of the ceramic shell.

Figure 7:
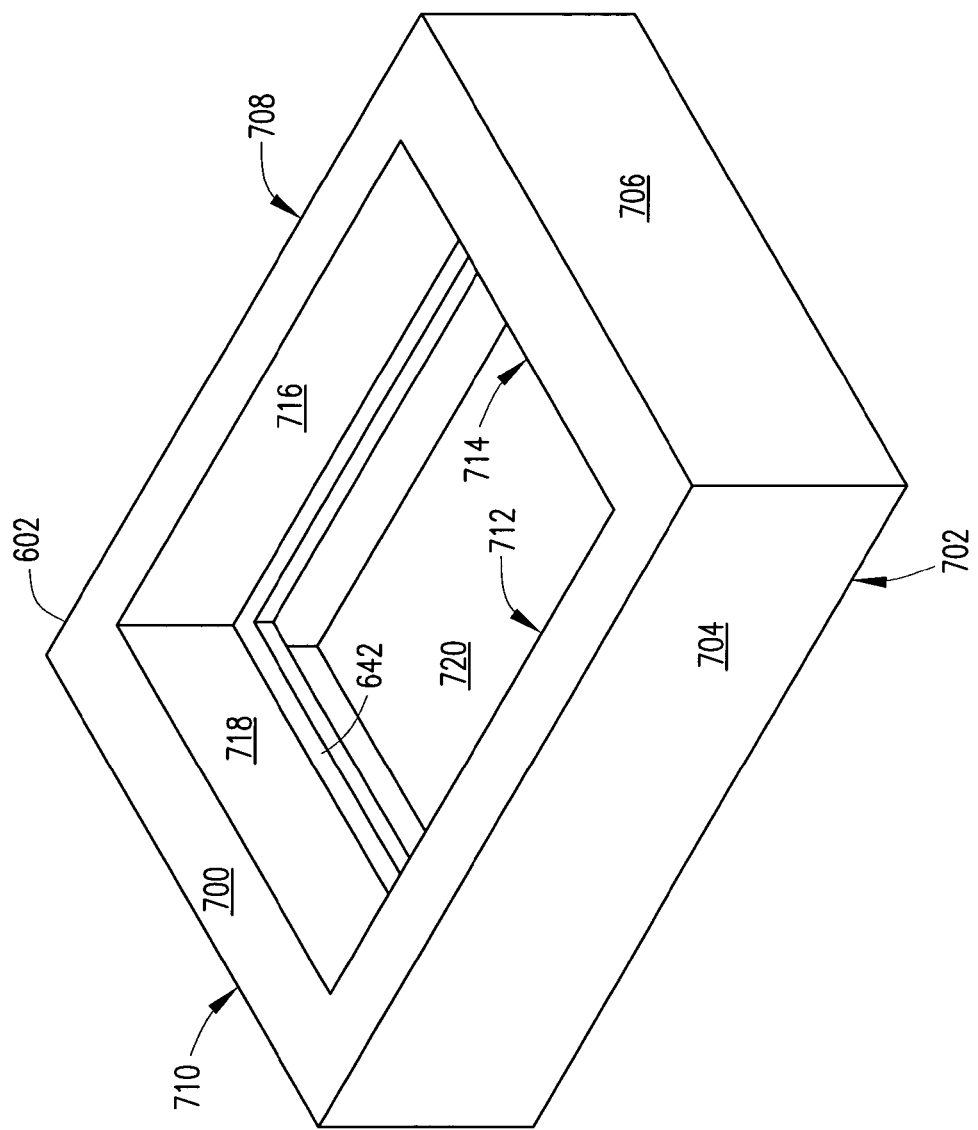
FIG. 7 is a perspective view of the heat sink of FIG. 6.

Referring now to FIG. 7, a perspective view of the heat sink 602 of FIG. 6 is illustrated. As shown, the heat sink 602 includes a top face 700, a bottom face 702, a front exterior face 704, two side exterior faces 706, 710, and a back exterior face 708. The heat sink 602 also includes a front interior face 712, two side interior faces 714, 718, and a back interior face 716. Along the front, back, and side interior faces 712, 714, 716, and 718, a lip 642 extends into a void 720 into which the interposer 604 is positioned. When the interposer is fully assembled, the lip 642 is sandwiched between the center layer and the two layers above and below the center layer thus holding the interposer 604 and heat sink 602 together securely. The lip 642 may be placed anywhere along the interior faces 712, 714, 716, and 718. In addition, the lip 642 may be located on only a portion of the interior faces or may not be present on all or some of the interior faces 712, 714, 716, and 718. Alternatively, the heat sink 602 may be fastened to the interposer 604 by other means such as bonding.

Figure 8:
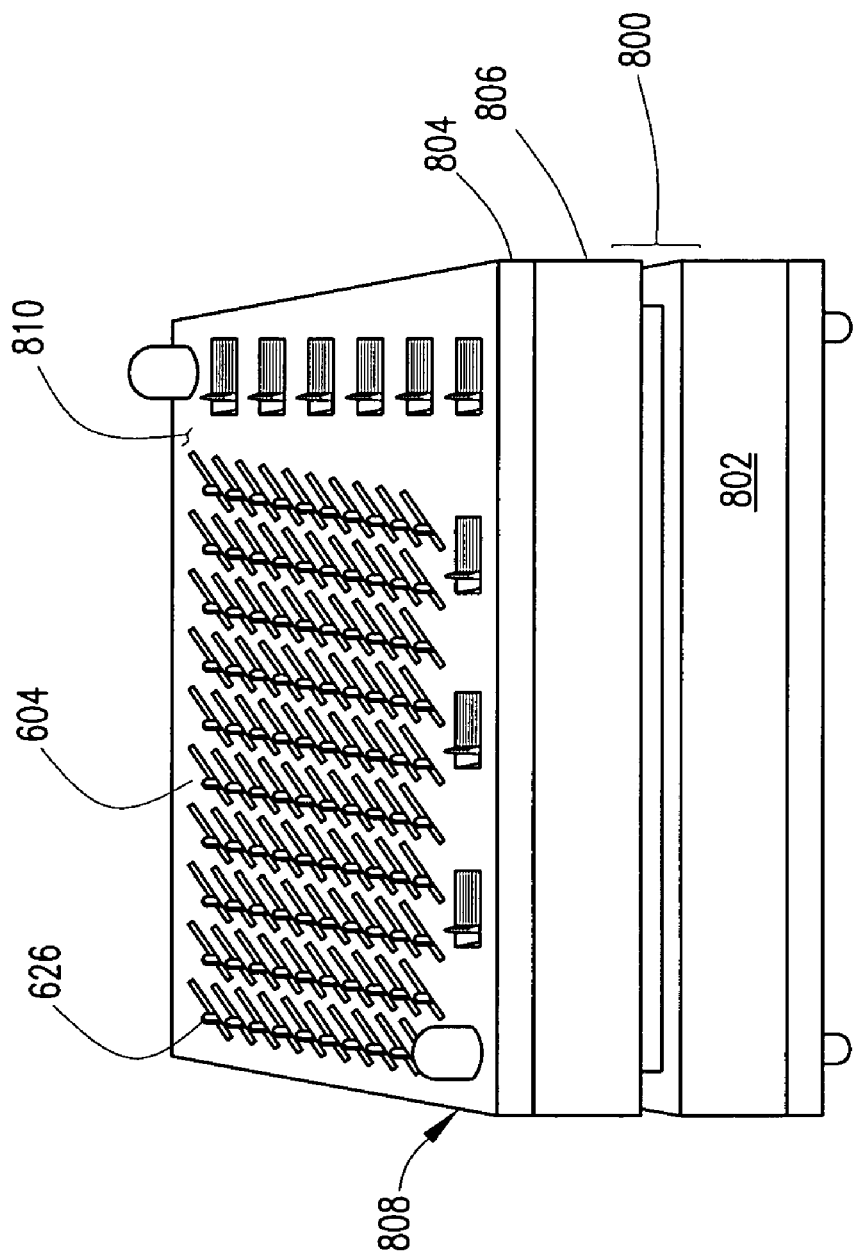
FIG. 8 is a perspective view of the interposer of FIG. 6 with the heat sink hidden from view.

Referring now to FIG. 8, a perspective view of the interposer 604 of FIG. 6 is illustrated. A top face 810 of the interposer includes apertures through which the contacts 626 extend. The interposer 604 may include a front face 802, two side faces 804, 808, and a back face 806. Along the faces 802, 804, 806, and 808 a notch 800 is configured to receive the lip 642 of the heat sink 602. In a manner similar to that of the lip 642 of the heat sink 602, the notch 800 may be oriented on only a portion of the faces or may not be present on all or some of the faces 802, 804, 806, and 808. Alternatively, the heat sink 602 may be fastened to the interposer 604 by other means such as bonding and therefore, the notch 800 may not be necessary.

Figure 9:
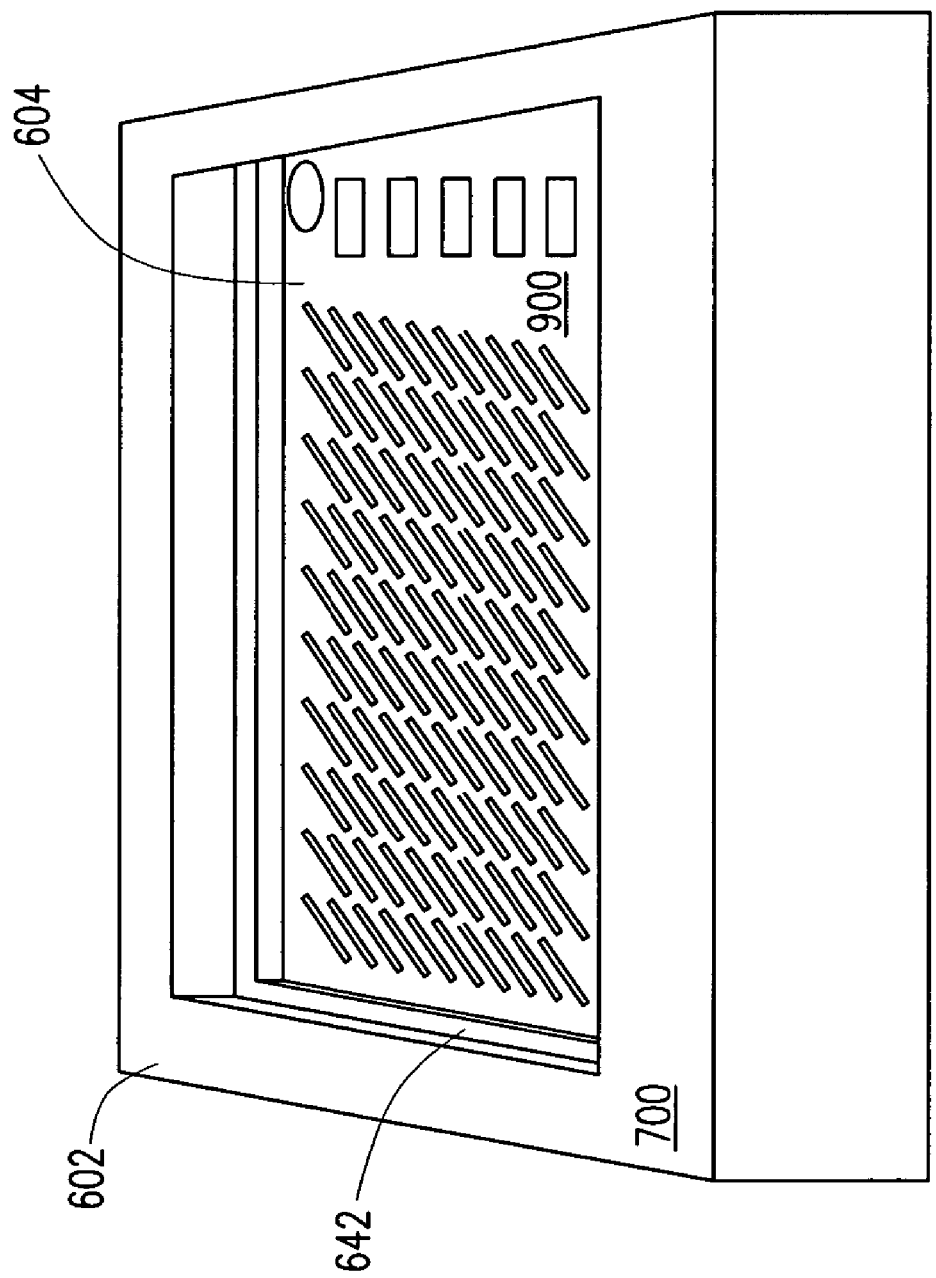
FIG. 9 is a perspective view of the heat sink of FIG. 7 and a portion of the interposer of FIG. 8.
Figure 10:
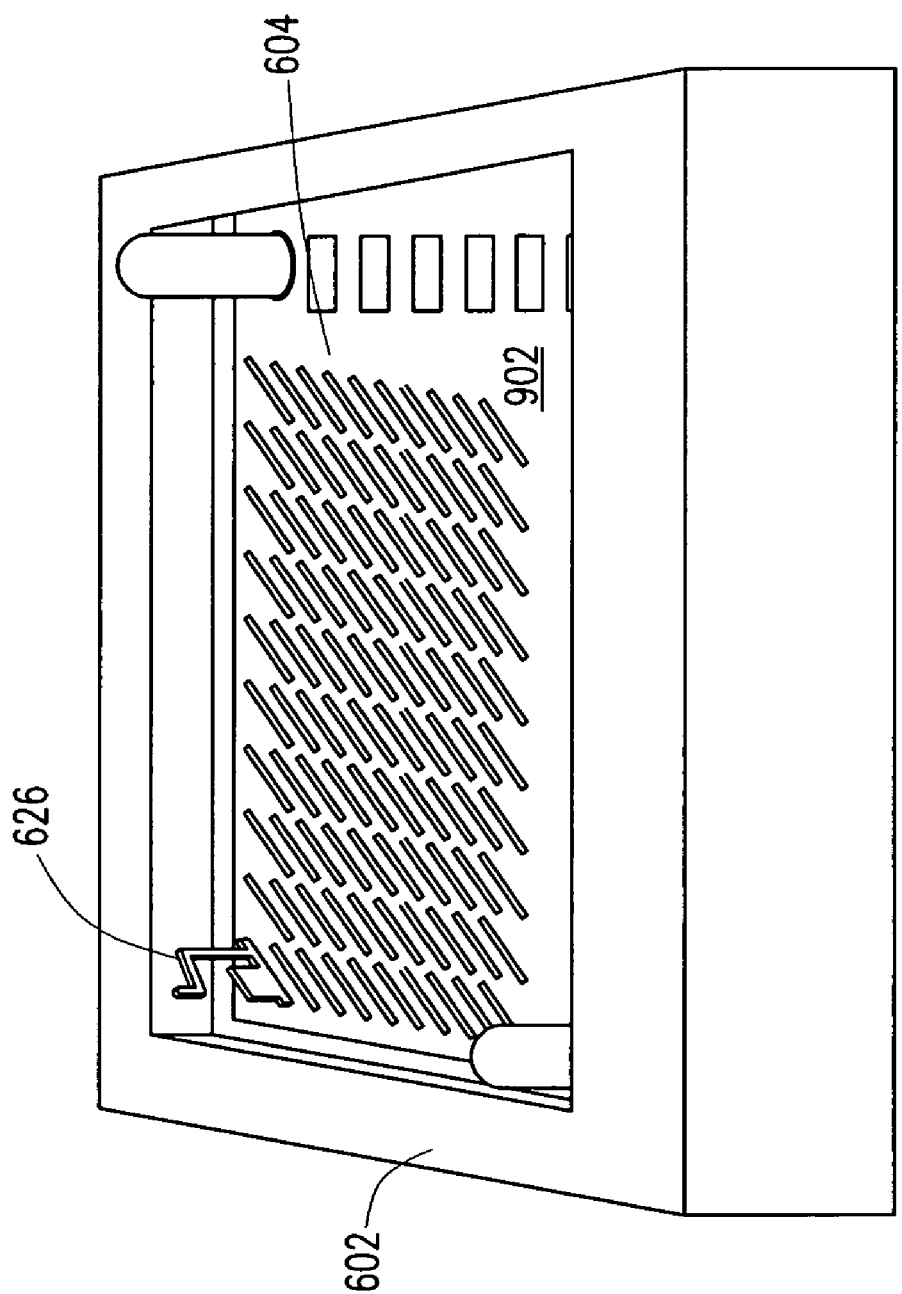
FIG. 10 is a perspective view of the heat sink of FIG. 7 and a portion of the interposer of FIG. 8.

Referring now to FIGS. 9 and 10, an integration of the interposer 604 to the heat sink 602 is illustrated. To laminate the heat sink 602 to the interposer 604, a lower layer of the interposer 604 is positioned in the void 720 created by the heat sink 602. The lower layer of the interposer 604 is positioned below the lip 642. The upper surface 900 of the lower layer of the interposer 604 may abut a lower surface of the lip 642. As shown in FIG. 10, an intermediate layer 902 of the interposer 604 is placed in the void 720 above the lower portion of the interposer 604. The intermediate layer 902 is configured to accommodate the lip 642 of the heat sink 602. An upper layer (not shown) is added on top of the intermediate layer 902 in order to lock the heat sink 602 into the interposer assembly.

As previously mentioned, the notch 800 may not be necessary in some applications, and therefore, the intermediate layer 902 may be formed in a similar configuration as the upper and lower layers. Furthermore, the interposer 604 may not be composed of layers and the configuration of the faces 802, 804, 806, and 808 may be made on a single piece interposer.

Referring now to FIG. 11, a method 1100 of forming the integral heat sink and interposer of an aspect of the present invention is illustrated. At step 1102, an interposer is formed to include a central void. The interposer may have a variety of shapes, thereby affecting the shape of the void defined by the interposer. At step 1104, a heat sink is formed to fit substantially in the void defined by the interposer. The heat sink may extend above or below the edges of the interposer, depending on the requirements of the system. At step 1106, the heat sink may be fastened to the interposer. The heat sink and interposer may be bonded or laminated together.

Referring now to FIG. 12, an alternate method 1200 of forming the integral heat sink and interposer of an aspect of the present invention is illustrated. At step 1202, a heat sink is formed with a central void. As noted above, the heat sink, and the void, may be configured in a variety of shapes and sizes. At step 1204 an interposer is configured to be substantially positioned in the void created by the heat sink. The heat sink and interposer are fastened together by a suitable means at step 1206. For example, the heat sink and interposer may be bonded or laminated together.

Although the above embodiments have shown the heat emitting element as an IC chip, it would be readily apparent to one skilled in the art that other heat emitting elements, such as a multichip module, may be utilized in accordance with the present invention. In addition, the PWB has been shown with a large pad to conduct heat from the heat sink to the thermal plane. However, the PWB may have a cutout along the top surface to allow a heat sink formed with a protrusion to directly contact the thermal plane. The protrusion of the heat sink may extend beyond the bottom surface of the interposer and fit through the PWB cutout in order to contact the thermal plane.

It should be understood that the heat sink and interposer of the present invention may be constructed of a number of suitable materials. In one aspect of the present invention, the heat sink may be constructed of copper, which provides for a very high thermal conductivity. In another aspect of the present invention, the heat sink may be constructed of aluminum which includes the properties of high thermal conductivity as well as low material density. In another aspect of the present invention, the layers of the interposer may be constructed from printed circuit board material. Examples of suitable printed circuit board construction materials include non-woven aramid fiber filled epoxy materials, such as those manufactured by Arlon. In still another aspect of the present invention, the interposer may be of a molded construction using glass filled polyphenylene sulfide (PPS) material, such as that manufactured under the tradename Fortron by Ticona. In still another aspect of the present invention, the interposer may be of a molded construction using a liquid crystal polymer (LCP) material.

Although a preferred embodiment of the method and apparatus of the present invention has been illustrated in the accompanying Drawings and described in the foregoing Detailed Description, it is understood that the invention is not limited to the embodiment disclosed, but is capable of numerous rearrangements, modifications, and substitutions without departing from the spirit of the invention as set forth and defined by the following claims.

What is claimed as new and desired to be protected by Letters Patent of the United States is:

1. A connector assembly for providing a thermal and an electrical interconnection between a first circuit element and a second circuit element, the connector assembly comprising:
    an interposer having a first side for contacting the first circuit element and a second side for contacting the second circuit element;
    at least one electrically conductive interconnector disposed within the interposer, the at least one electrically conductive interconnector adapted to provide an electrical interconnection between the first circuit element and the second circuit element;
    a single thermally conductive member extending from the first side of the interposer to the second side of the interposer, the single thermally conductive member having a first surface exposed from the first side of the interposer for contact with the first circuit element and a second surface exposed from the second side of the interposer for contact with the second element, and the single thermally conductive member adapted to provide a conductive thermal interconnection between the first circuit element and the second circuit element; and
    wherein the single thermally conductive member is arranged in a ring-type configuration to form a border around the interposer.

2. The connector assembly of claim 1, wherein the single thermally conductive member comprises a heat sink.

3. The connector assembly of claim 1, wherein the first circuit element comprises an integrated circuit package.

4. The connector assembly of claim 1, wherein the second circuit element comprises a printed wiring board.

5. The connector assembly of claim 4, wherein the printed wiring board comprises at least one thermal plane.

6. The connector assembly of claim 5 further comprising a pad adapted to facilitate transfer of heat from the single thermally conductive member to the thermal plane.

7. The connector assembly of claim 6, wherein the pad comprises a solid metal plug connected to the thermal plane.

8. The connector assembly of claim 4, wherein the second circuit element comprises at least one circuitry layer.

9. The connector assembly of claim 1, wherein the interposer is comprised of a plurality of layers.

10. The connector assembly of claim 1, wherein the single thermally conductive member includes a lip adapted to retain the single thermally conductive member within the interposer.

11. The connector assembly of claim 10 wherein the interposer includes a notch configured to receive the lip of the single thermally conductive member.

12. A connector assembly for providing a thermal and an electrical interconnection between a first circuit element and a second circuit element, the connector assembly comprising:
    an interposer having a first side for contacting the first circuit element and a second side for contacting the second circuit element, the interposer further having a single thermally conductive member integrally formed therewith and extending from the first side of the interposer to the second side of the interposer, the single thermally conductive member having a first surface exposed from the first side of the interposer for contact with the first circuit element and a second surface exposed from the second side of the interposer for contact with the second element, and the single thermally conductive member adapted to directly transfer thermal energy between the first circuit element and the second circuit element;
    at least one electrically conductive interconnector disposed within the interposer, the at least one electrically conductive interconnector adapted to provide an electrical interconnection between the first circuit element and the second circuit element; and
    wherein the single thermally conductive member is arranged in a ring-type configuration to form a border around the interposer.

13. The connector assembly of claim 12, wherein the single thermally conductive member comprises a heat sink.

14. The connector assembly of claim 12, wherein the first circuit element comprises an integrated circuit package.

15. The connector assembly of claim 12, wherein the second circuit element comprises a printed wiring board.

16. The connector assembly of claim 15, wherein the printed wiring board comprises at least one thermal plane.

17. The connector assembly of claim 16 further comprising a pad adapted to facilitate transfer of heat from the single thermally conductive member to the thermal plane.

18. The connector assembly of claim 17, wherein the pad comprises a solid metal plug connected to the thermal plane.

19. The connector assembly of claim 15, wherein the second circuit element comprises at least one circuitry layer.

20. The connector assembly of claim 12, wherein the interposer is comprised of a plurality of layers.

21. The connector assembly of claim 12, wherein the at single thermally conductive member includes a lip adapted to retain the single thermally conductive member within the interposer.

22. The connector assembly of claim 21 wherein the interposer includes a notch configured to receive the lip of the single thermally conductive member.

* * * * *